United States Patent
Lin et al.

(10) Patent No.: US 8,475,178 B2
(45) Date of Patent: Jul. 2, 2013

(54) ELECTRICAL CONNECTOR HAVING IMPROVED INSULATIVE HOUSING

(75) Inventors: Wei-Chih Lin, Tu-Cheng (TW); Yen-Chih Chang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 203 days.

(21) Appl. No.: 12/972,557

(22) Filed: Dec. 20, 2010

(65) Prior Publication Data

US 2011/0151689 A1 Jun. 23, 2011

(30) Foreign Application Priority Data

Dec. 18, 2009 (TW) .............................. 98223702 U

(51) Int. Cl.
*H01R 12/00* (2006.01)
*H05K 1/00* (2006.01)

(52) U.S. Cl.
USPC ........................................... 439/66; 439/525

(58) Field of Classification Search
USPC .............................................. 439/66, 68, 525
See application file for complete search history.

(56) References Cited

U.S. PATENT DOCUMENTS

| | | | |
|---|---|---|---|
| 5,174,763 A * | 12/1992 | Wilson ............................ | 439/66 |
| 6,247,939 B1 * | 6/2001 | Bestul et al. .................... | 439/66 |
| 6,506,082 B1 * | 1/2003 | Meek et al. ..................... | 439/700 |
| 7,025,602 B1 * | 4/2006 | Hwang ........................... | 439/66 |
| 7,404,717 B2 | 7/2008 | Kazama | |
| 7,435,099 B2 * | 10/2008 | Kirkus ............................ | 439/66 |
| 7,470,149 B2 * | 12/2008 | Kazama et al. .......... | 439/607.05 |
| 7,753,695 B2 * | 7/2010 | Howell ............................ | 439/82 |
| 7,845,955 B2 * | 12/2010 | Nakayama et al. ............. | 439/66 |
| 7,922,537 B2 * | 4/2011 | Chang et al. ............. | 439/607.57 |
| 8,070,497 B2 * | 12/2011 | Lin .................................. | 439/66 |
| 2008/0045047 A1 * | 2/2008 | Chen et al. ..................... | 439/68 |
| 2009/0311890 A1 * | 12/2009 | Nakayama et al. ............. | 439/91 |
| 2010/0009557 A1 * | 1/2010 | Hsiao et al. ..................... | 439/66 |
| 2011/0014814 A1 * | 1/2011 | Chang et al. ............. | 439/607.05 |

* cited by examiner

*Primary Examiner* — Hae Moon Hyeon
(74) *Attorney, Agent, or Firm* — Wei Te Chung; Ming Chieh Chang

(57) ABSTRACT

An electrical connector includes a substrate, an upper plate, a lower plate, and a number of contacts. The substrate has a number of passageways. The upper plate and the lower plate are mounted upon and below the substrate, respectively. The upper plate and the lower plate both have a number of apertures corresponding to the passageways and a recess to receive the substrate. The contacts are received in the passageways and the apertures.

15 Claims, 4 Drawing Sheets

ELECTRICAL CONNECTOR HAVING IMPROVED INSULATIVE HOUSING

BACKGROUND OF THE INVENTION

1. Field of the Invention

The present invention relates to an electrical connector, and more particularly to an electrical connector having an insulative housing which is formed by an upper and a lower structural boards with a middle board surrounded by the upper and the lower boards thereby reducing the tolerance of the insulative housing while increasing strength to the upper and lower boards.

2. Description of Related Art

U.S. Pat. No. 7,404,717 issued to Kazama on Jul. 29, 2008 discloses a connector comprising a unitary contact and an insulative housing. The unitary contact includes a contact spring having a leg portion, a body portion, and a tightly twisted neck portion. The uniform insulative housing includes a lower holder, an upper holder, and a floatable guide plate. The upper and lower holders have reception holes from which the leg portion and the neck portion are allowed to project over and the body portion is limited from coming out. The floatable guide plate has a guide hole into which the neck portion is inserted, and a supporting spring is interposed between the upper holder and the float type guide plate.

The floatable guide plate and the lower holder are both configured with thin thickness because the insulative housing has a rigidly restricted height, so rendering the overall strength of the floatable guide plate and the lower holder deficient. Furthermore, the floatable guide plate, the upper holder and the lower holder are stacked together, such arrangement makes the insulative housing has a bigger tolerance in a vertical direction as the tolerance from each board accumulated one after another.

Therefore, the electrical connector discussed above with improved insulative housing is required.

SUMMARY OF THE INVENTION

An object of the present invention is to provide an electrical connector having an insulative housing which is formed by an upper and a lower structural boards with a middle board surrounded by the upper and the lower boards thereby reducing the tolerance of the insulative housing while increasing strength to the upper and lower boards.

In order to achieve the object set forth, an electrical connector made according to the present invention comprises an upper and a lower plates stacked together and defining a space therebetween, a substrate disposed within the space. Each of the upper and lower plates is provided with upper and lower limiting apertures aligned with each other. The substrate is provided with passageways each aligning with a corresponding pair of upper and lower limiting apertures. A plurality of contacts is disposed over the passageways with contact points projecting beyond the apertures.

To further achieve the aforementioned object, an electrical connector comprises an upper plate, a lower plate, a substrate, and a plurality of contacts. The upper plate and the lower plate engage with each other and both define a plurality of apertures. The substrate is inhibited between the upper plate and the lower plate. The substrate has a plurality of passageways corresponding to the apertures. The contacts are received in the passageways and the apertures.

Other objects, advantages and novel features of the invention will become more apparent from the following detailed description of a preferred embodiment when taken in conjunction with the accompanying drawings.

DETAILED DESCRIPTION OF THE INVENTION

Figure 1:
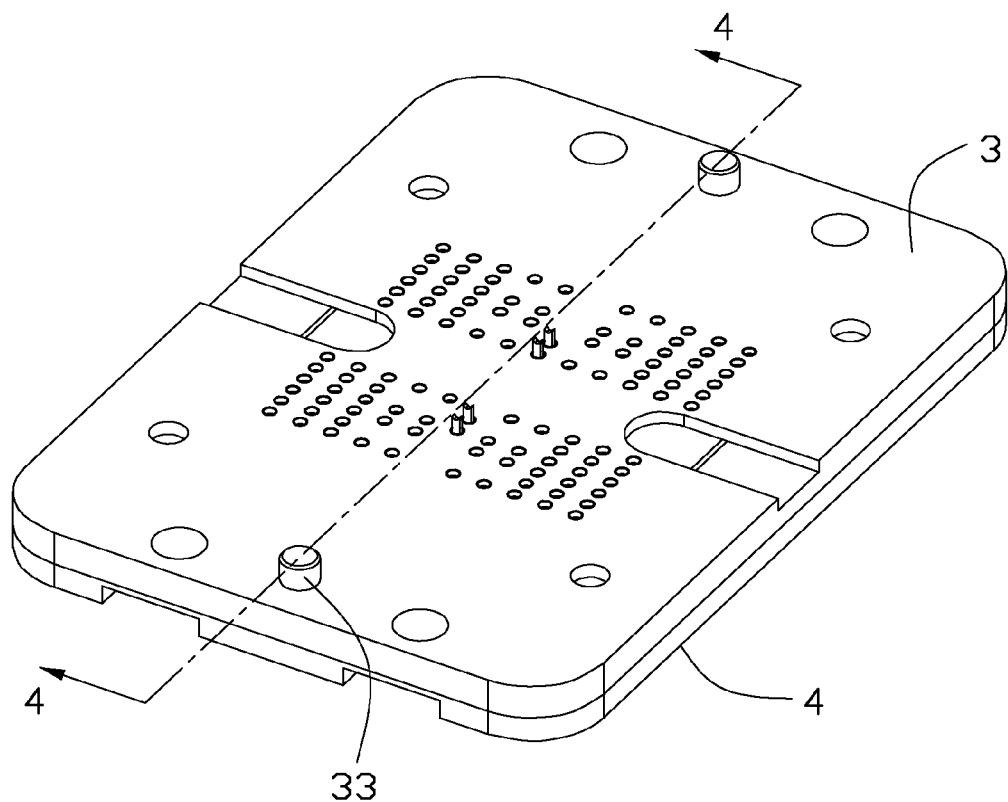
FIG. 1 is an assembled, perspective view of an electrical connector in accordance with the present invention.
Figure 2:
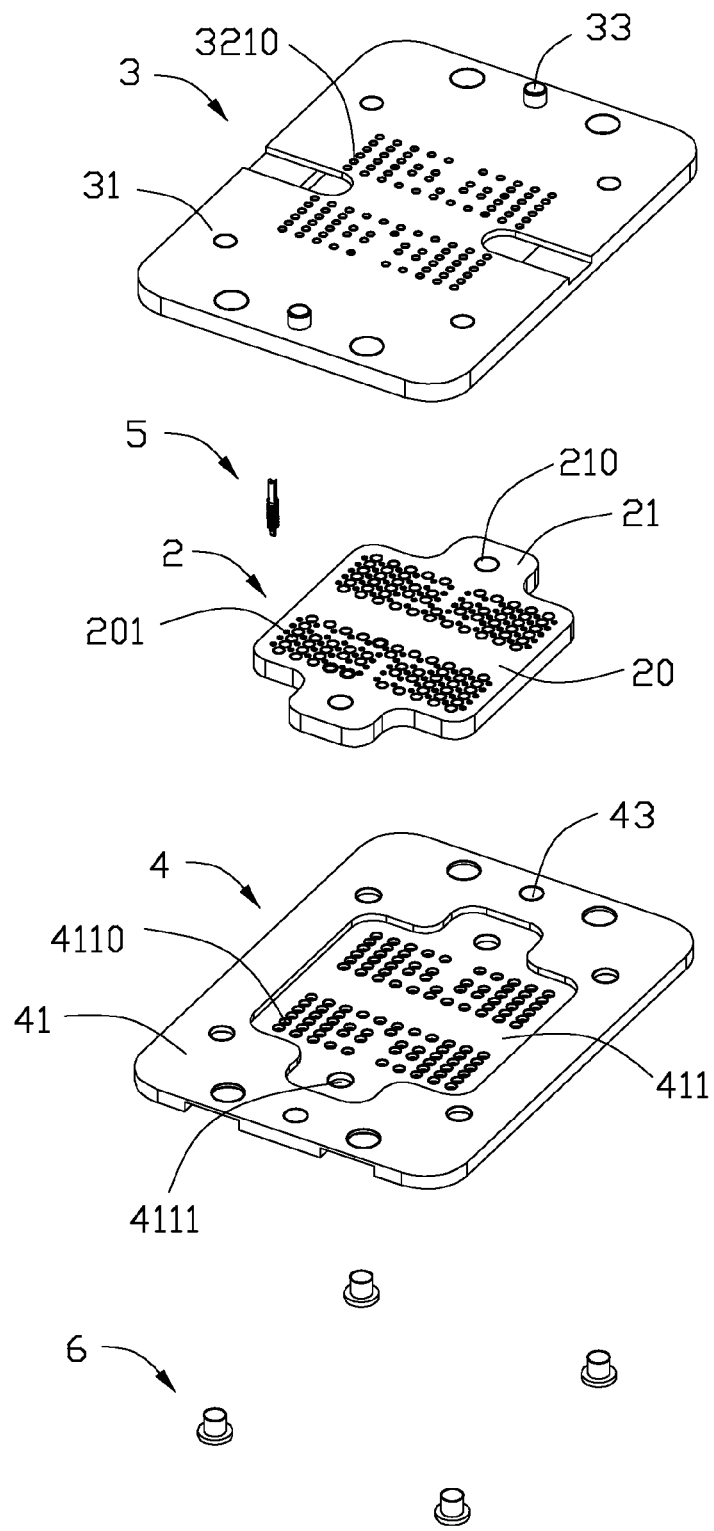
FIG. 2 is an exposed, perspective view of the electrical connector in FIG. 1.

FIG. 1 and FIG. 2 show an electrical connector for testing an electrical package (not shown). The electrical connector comprises a uniform insulative housing and a plurality of contact 5 received in the insulative housing. The insulative housing includes a substrate 2, an upper plate 3, and a lower plate 4.

Figure 3:
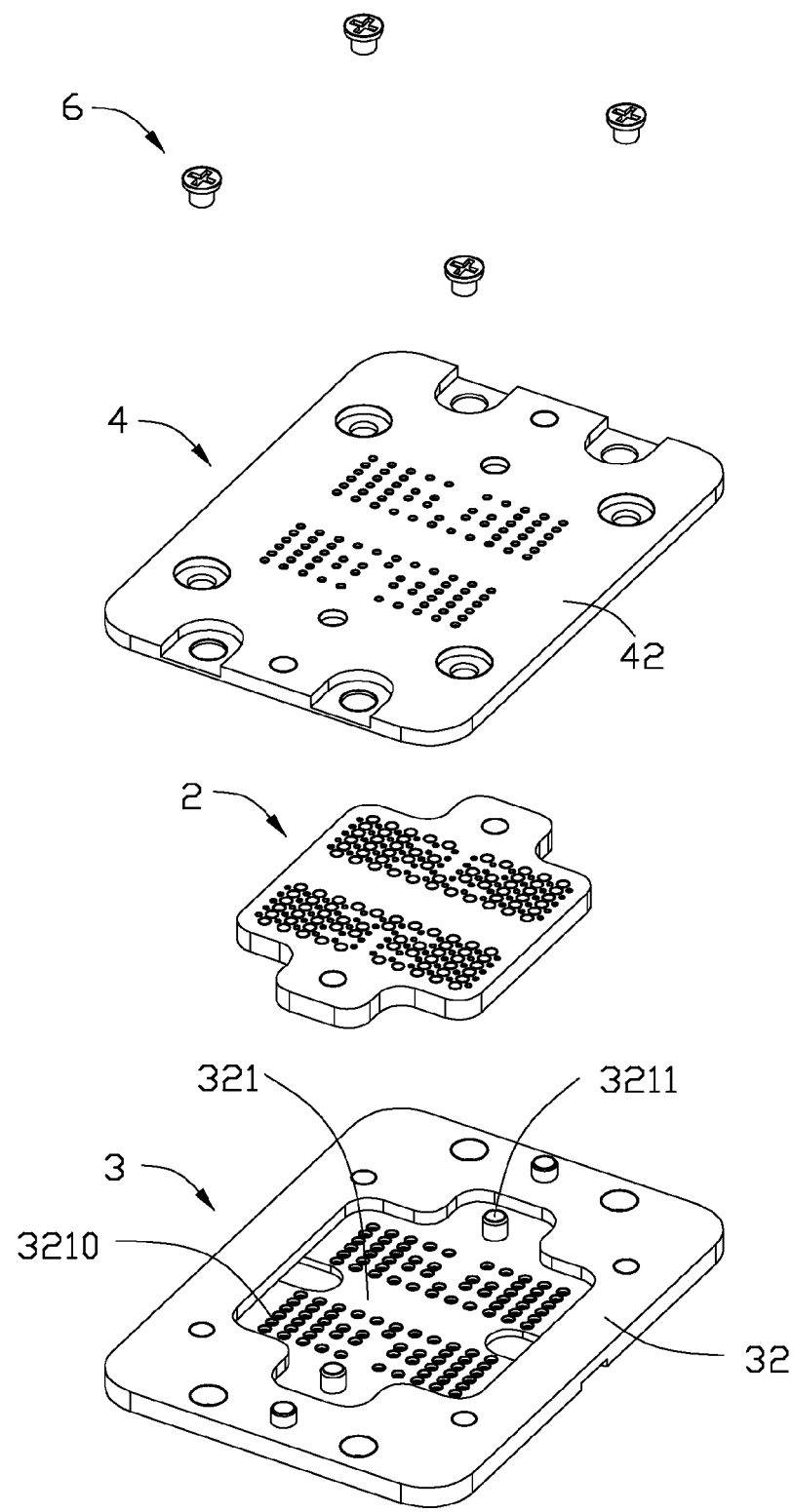
FIG. 3 is similar with FIG. 2, but take from another side.

Referring to FIG. 2 and FIG. 3, the substrate 2 is configured with a planar configuration and made by a same material with a printed circuit board (not shown), such as fiberglass reinforced panel, (FRP). The substrate 2 has a substantially rectangular receiving portion 20 defining a plurality of passageways 201 for retaining the contacts 5. A pair of ears 21 are disposed on opposite sides of the receiving portion 20 and each defines a through hole 210 adapted to orientate the substrate 2. In order to provide some special functions for the electrical connector, the substrate 2 is coated with some metallic coating 22 on a top surface and a bottom surface thereof.

The upper plate 3 and the lower plate 4 are both made of insulative material and both have a same rectangular configuration. A bottom surface 32 of the upper plate 3 is used to engage with a top surface 41 of the lower plate 4. Two recesses 321, 411 commonly forming a space, are correspondingly defined on the bottom surface 32 of the upper plate 3 and the top surface 41 of the lower plate 4, respectively, for receiving the substrate 2. The upper plate 3 defines an upper contact region (not labeled) located above the recess 321 and surrounded by the upper securing region (not labeled) and the lower plate 4 defines a lower contact region (not labeled) located below the recess 411 and surrounded by the lower securing region (not labeled). The recesses 321, 411 of the upper plate 3 and the lower plate 4 both have apertures 3210, 4110 corresponding to the passageways 201 of the substrate 2 to receive the contacts 5. It is noted that the thickness of the substrate 2 is not less than a sum of those of the upper contact region and the lower contact region.

A pair of posts 33 are disposed on opposite sides and located outside of the recess 321. Each post 33 not only protrudes upwardly from a top surface 31 of the upper plate 3, but protrudes downwardly from the bottom surface 32 of the upper plate 3. A part of the posts 33 protruding from the top surface 32 of the upper plate 3 is used to orientate other element (not shown) to be assembled on the upper plate 3. A part of the posts 33 protruding from the bottom surface 32 of the upper plate 3 engages with corresponding holes 43 of the lower plate 4. The recess 321 of the upper plate 3 has poles 3211 to insert into the through hole 210 of the substrate 2 in present embodiment in FIG. 4, the poles 3211 can further extend into another holes 4111 of the lower plate 4 to prevent the upper plate 3, the substrate 2 and the lower plate 4 from horizontally moving in another embodiment. When the substrate 2 with the contacts 5 is assembled into the recesses 321, 411, the upper plate 3 and the lower plate 4 are fixed by a plurality of screws 6 to secure the electrical connector together.

Figure 4:
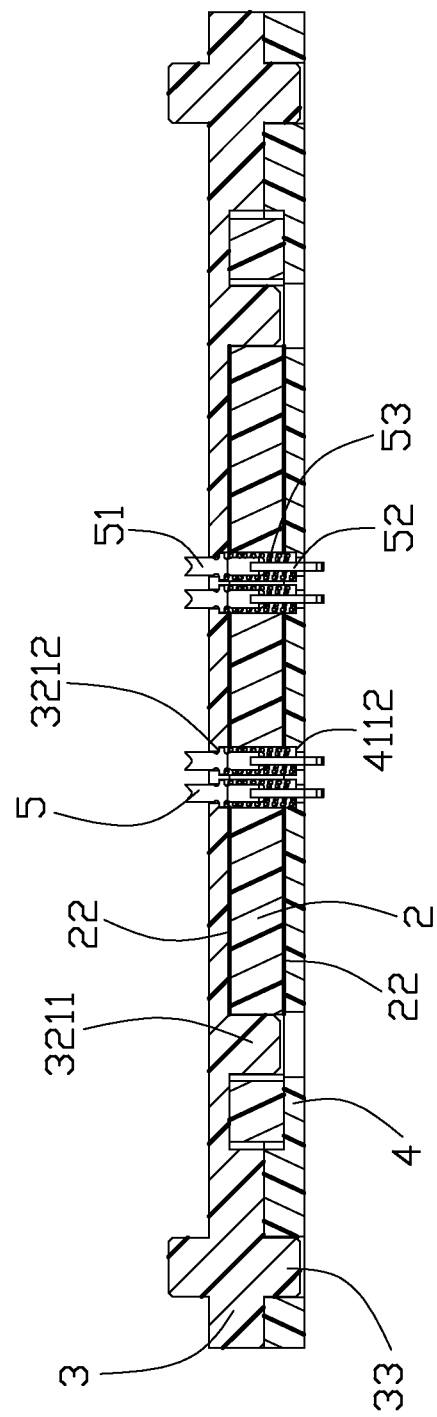
FIG. 4 is a cross-sectional view taken along line 4-4 of FIG. 1.

Referring to FIG. 4, the thickness of the substrate 2 is smaller or substantially equal to the total height of compartment formed by two the recesses 321, 411 of the upper plate 3 and the lower plate 4, so the upper plate 3 directly mates the lower plate 4 and the substrate 2 is encased by the upper plate 3 and the lower plate 4. The contacts 5 are retained in the passageways 201 and the apertures 3210, 4110 and extend beyond the top surface 31 of the upper plate 3 and a bottom surface 42 of the lower plate 4. The contacts 5 are limited to move in vertical direction by shoulders or limiting structures 3212, 4112 defined in the each aperture 3210, 4110. Specifically, the contacts 5 include a plurality of upper contacts 51 disposed in the corresponding aperture 3210 of the upper plate 3, respectively, each of said upper contacts 51 defines an upper contacting section extending upwardly beyond the top surface 31 of the upper plate 3 and a lower connecting section downwardly extending into the space formed by the recesses 321, 411. The contacts 5 further include a plurality of lower contacts 52 disposed in the corresponding apertures 4110 and associated with the upper contacts 51, respectively, each of said lower contacts 52 defines a lower contacting section extending downwardly beyond a bottom face of the corresponding lower plate 4 and an upper connecting section upwardly extending into the space formed by the recesses 321, 411 and mechanically and electrically connected to the lower connecting section of the corresponding upper contact 51. A plurality of springs 53 are associated with the corresponding upper contacts 51 and lower contacts 52, respectively, and urging the corresponding upper contacts 51 toward the upper plate 3 and the corresponding lower contacts 52 toward the lower plate 4 away from the corresponding upper contacts 51, respectively, The substrate 2 encased or inhibited by the upper plate 3 and the lower plate 4 can be concluded at least following advantages: firstly, the electrical connector is featured a smaller stacking tolerance for only the upper plate 3 and the lower plate 4 need to be considered; secondly, the upper plate 3 and the lower plate 4 both have enough strength for increased height thereof; thirdly, the cost is reduced for the substrate 2 having a small area; fourthly, the substrate 2 having metallic coating 22 is encased by the upper plate 3 and the lower plate 4 to avoid the metallic coating shorting with outer elements.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
   upper and lower plates stacked together and defining a recess therebetween, each of the upper and lower plates provided with upper and lower limiting apertures aligned with each other;
   a substrate disposed within the recess and provided with passageways each aligning with a corresponding pair of upper and lower limiting apertures; and
   a plurality of contacts disposed over the passageways with contact points projecting beyond the apertures; and wherein
   the substrate is made of material of a printed circuit board and equipped with metallic coating thereof.

2. The electrical connector as claimed in claim 1, wherein a plurality of poles integrally extend from a bottom surface of the recess of the upper plate to be inserted into corresponding through holes defined in the substrate to guide the upper plate to be mounted to the substrate.

3. The electrical connector as claimed in claim 2, wherein a plurality of posts integrally extend out of the recess of the upper plate to be inserted into corresponding holes defined in the lower plate to guide the upper plate to be mounted to the lower plate.

4. The electrical connector as claimed in claim 3, wherein the substrate includes a substantially rectangular receiving portion and a pair of ears disposed on opposite sides of the receiving portion, and the through holes are defined in the ears.

5. The electrical connector as claimed in claim 4, wherein the recess has a substantially similar shape with the substrate.

6. The electrical connector as claimed in claim 5, wherein the passageways are defined in the receiving portion.

7. The electrical connector as claimed in claim 6, wherein the contacts extend beyond a top surface of the upper plate and a bottom surface of the lower plate, and each aperture of the upper plate and the lower plate has a shoulder to limit the contact to move in a vertical direction.

8. The electrical connector as claimed in claim 7, wherein the substrate plates some metallic coatings on a top surface and a bottom surface.

9. An electrical connector comprising:
   an upper plate and a lower plate engaging with each other and a plurality of apertures defined on both of the upper plate and the lower plate;
   a substrate inhibited between the upper plate and the lower plate and having a plurality of passageways corresponding to the apertures; and
   a plurality of contacts received in the passageways and the apertures; wherein
   a bottom surface of the upper plate and a top surface of the bottom plate both define a recess to receive the substrate; wherein
   a plurality of poles integrally formed from a bottom surface of the recess of the upper plate to be inserted into corresponding through holes defined on the substrate to guide the upper plate mounted to the substrate, meanwhile a plurality of posts integrally formed out of the recess of the upper plate to be inserted into corresponding holes defined on the lower plate to guide the upper plate mounted to the lower plate; wherein
   the substrate plates some metallic coatings on a top surface and a bottom surface.

10. The electrical connector as claimed in claim 9, wherein the upper plate and the lower plate are secured by a plurality of screws.

11. An electrical connector comprising:
    an upper plate and a lower plate arranged spaced from each other in a vertical direction and parallel to each other, said upper plate defining an upper contact region with a plurality of upper apertures extending therethrough, and said lower plate defining a lower contact region with a plurality of lower apertures extending therethrough under condition that said upper contact region and said lower contact region are spaced from each other in the vertical direction with a space therebetween while the upper apertures are aligned with the corresponding lower apertures in said vertical direction;
    a plurality of upper contacts disposed in the corresponding upper apertures, respectively, each of said upper contacts defining an upper contacting section extending upwardly beyond an upper face of the upper plate and a lower connecting section downwardly extending into the space;

a plurality of lower contacts disposed in the corresponding lower apertures and associated with the upper contacts, respectively, each of said lower contacts defining a lower contacting section extending downwardly beyond a bottom face of the corresponding lower plate and an upper connecting section upwardly extending into the space and mechanically and electrically connected to the lower connecting section of the corresponding upper contact; and a plurality of springs associated with the corresponding upper contacts and lower contacts, respectively, and urging the corresponding upper contacts toward the upper plate and the corresponding lower contacts toward the lower plate away from the corresponding upper contacts, respectively; wherein said upper plate defines an upper securing region surrounding the upper contact region, and said lower plate defines a lower securing region surrounding the lower contact region stacked with the upper contact region for combing the upper plate and the lower plate together; wherein an intermediate substrate is snugly received in the space in the vertical direction, and said substrate defines a plurality of intermediate through holes each receiving the corresponding spring, the connecting section of the corresponding upper contact and the connecting section of the corresponding lower contact; wherein said substrate is made of material of a printed circuit board and equipped with metallic coating thereof.

12. The electrical connector as claimed in claim 11, wherein each of the upper apertures is equipped with an upper limiting structure to restrict upward movement of the corresponding upper contact, and each of the lower apertures is equipped with a lower limiting structure to restrict downward movement of the corresponding lower contact.

13. The electrical connector as claimed in claim 12, wherein each of the springs extends into at least one of the corresponding upper aperture and the corresponding lower aperture.

14. The electrical connector as claimed in claim 11, wherein a thickness of the substrate is not less than a sum of a thickness of the upper contact region and that of the lower contact region.

15. The electrical connector as claimed in claim 11, wherein one of the upper securing region and the lower securing region defines a pole extending into a hole defined in the other for aligning the upper plate and the lower plate together in said vertical direction.

* * * * *